(12) United States Patent
Naito et al.

(10) Patent No.: US 10,496,231 B2
(45) Date of Patent: Dec. 3, 2019

(54) TOUCH PANEL

(71) Applicant: Futaba Corporation, Mobara-shi, Chiba OT (JP)

(72) Inventors: Yasuyuki Naito, Mobara (JP); Kiyoyuki Deguchi, Mobara (JP); Takashi Inoue, Mobara (JP); Tomohiro Ishii, Mobara (JP)

(73) Assignee: Futaba Corporation, Chiba (JP)

( * ) Notice: Subject to any disclaimer, the term of this patent is extended or adjusted under 35 U.S.C. 154(b) by 161 days.

(21) Appl. No.: 15/459,752

(22) Filed: Mar. 15, 2017

(65) Prior Publication Data

US 2017/0329434 A1 Nov. 16, 2017

(30) Foreign Application Priority Data

May 16, 2016 (JP) .................................. 2016-098001

(51) Int. Cl.
*G06F 3/044* (2006.01)
*H01L 27/02* (2006.01)
*H05K 9/00* (2006.01)

(52) U.S. Cl.
CPC ............ *G06F 3/0443* (2019.05); *G06F 3/044* (2013.01); *H01L 27/0248* (2013.01); *H05K 9/0079* (2013.01); *G06F 2203/04107* (2013.01); *G06F 2203/04111* (2013.01)

(58) Field of Classification Search
CPC ......... G06F 3/041; G06F 3/0412; G06F 3/044
See application file for complete search history.

(56) References Cited

U.S. PATENT DOCUMENTS

| 6,181,284 B1* | 1/2001 | Madsen | G06F 1/1616 |
| | | | 343/702 |
| 6,268,999 B1* | 7/2001 | Tg | G06K 19/077 |
| | | | 361/679.02 |
| 6,459,460 B1* | 10/2002 | Yamanaka | G02F 1/133308 |
| | | | 349/58 |
| 8,573,984 B2* | 11/2013 | Miller | G06F 3/044 |
| | | | 439/67 |
| 10,031,553 B2* | 7/2018 | Yang | G06F 1/1626 |
| 2005/0046372 A1* | 3/2005 | Heo | B60S 1/0818 |
| | | | 318/483 |
| 2006/0209502 A1* | 9/2006 | Sakata | G06F 1/1601 |
| | | | 361/679.22 |
| 2007/0051877 A1* | 3/2007 | Sakai | G02B 6/421 |
| | | | 250/214 R |

(Continued)

FOREIGN PATENT DOCUMENTS

JP 2010218542 A 9/2010

*Primary Examiner* — Patrick F Marinelli
(74) *Attorney, Agent, or Firm* — Quarles & Brady LLP (57) ABSTRACT

A touch panel having a noise guiding member for guiding noise current such as static electricity generated during operating is provided. The noise guiding member is made of a metal material, and is arranged in a position that a front surface side end portion does not project from a front surface of a housing unit. In a state that a back surface side end portion is connected to the ground G, the noise guiding member passes through a back surface from the front surface of the housing unit. The touch panel can reduce manufacturing costs without design restriction, and control adverse effect subjecting by noise current due to external discharge such as static electricity generated when operating the touch panel.

2 Claims, 6 Drawing Sheets

(56) References Cited

U.S. PATENT DOCUMENTS

| | | | |
|---|---|---|---|
| 2007/0115268 A1* | 5/2007 | Jang | G02F 1/133308 345/183 |
| 2008/0049949 A1* | 2/2008 | Snider | H04B 1/082 381/86 |
| 2009/0014716 A1* | 1/2009 | Yamaga | H01L 51/0545 257/40 |
| 2010/0220071 A1 | 9/2010 | Nishihara et al. | |
| 2010/0285260 A1* | 11/2010 | Bookbinder | B32B 3/02 428/45 |
| 2013/0057337 A1* | 3/2013 | Kang | G06F 3/0418 327/551 |
| 2013/0133947 A1* | 5/2013 | Miller | H01R 4/06 174/84 C |
| 2013/0223025 A1* | 8/2013 | Fujieda | H05K 7/02 361/753 |
| 2014/0267153 A1* | 9/2014 | Heim | G06F 3/0213 345/174 |
| 2015/0103453 A1* | 4/2015 | Kaufman | H05K 9/0067 361/56 |
| 2015/0198976 A1* | 7/2015 | Raff | G06F 1/1637 361/679.3 |
| 2015/0301669 A1* | 10/2015 | Miyazaki | G06F 3/044 345/173 |
| 2016/0109974 A1* | 4/2016 | Lee | B32B 9/04 345/173 |
| 2016/0132157 A1* | 5/2016 | Lee | G06F 3/044 345/174 |
| 2016/0270270 A1* | 9/2016 | Madsen | H04B 1/08 |
| 2017/0090656 A1* | 3/2017 | Naito | G06F 3/0412 |
| 2017/0090657 A1* | 3/2017 | Naito | G06F 3/0416 |
| 2017/0253717 A1* | 9/2017 | Shin | C08K 3/041 |
| 2017/0329434 A1* | 11/2017 | Naito | G06F 3/044 |
| 2017/0338000 A1* | 11/2017 | Kim | C08K 3/04 |
| 2017/0344150 A1* | 11/2017 | Zou | G06F 3/044 |

\* cited by examiner

TOUCH PANEL

CROSS REFERENCE TO RELATED APPLICATIONS

This application is based on and claims the benefit of priority of Japanese Patent Application No. 2016-098001 filed on May 16, 2016. The contents of this application are incorporated herein by reference in their entirety.

BACKGROUND OF THE INVENTION

The present invention relates to a projection-capacitive touch panel which is capable of detecting multi-points of fingertip.

Recently, in electronic device such as a mobile phone, a smart device (for example, a tablet device, an electronic book reader and so on), a car navigation system and so on, a display device (display device with touch panel: touch panel device) including a touch panel function which has effects intuitive operation and excellent durability is mounted as one form of interface.

The touch panel is a position input system so as to detect a touch from an indicator such as a finger or stylus and so as to identify a position coordinate of the touch. The detection method is divided broadly into a resistive film system including an analog resistive film type and a matrix resistive film type, a capacitance system including a surface capacitance type and a projection-capacitive type, an optical system including an infrared scanning type and a retroreflective type, and an ultrasonic system including a surface acoustic wave type and a plate wave type. Various types are put to practical use.

In recent years, especially the demand for the projection-capacitive type touch panel in the above mentioned detection method is expanded. The projection-capacitive type touch panel detects the capacitive change of an electrode near a fingertip as a position coordinate on the touch panel from two vertical and horizontal electrode rows when the fingertip approaches.

Patent Literature 1 described below discloses a capacitive type touch panel. The touch panel has a plurality of detection electrodes for detecting that a conductive body approaches a front surface of the substrate, and a wiring electrode for transmitting a detection signal to an external circuit. The wiring electrode is electrically connected to the detection electrode. Further, the plurality of the detection electrodes has a detection area formed on a central portion of the substrate. The wiring electrode connected to the detection electrodes has a wiring area formed by being collected in an outer side of the detection area.

Meanwhile, in a capacitance coupling type touch panel, when a conductor approaches the detection electrode, a capacitance formed between the conductor and the detection electrode is changed, weak current flowing in the changed capacitance is detected, and thereby a conductor position is identified.

However, when noise current caused by external discharge such as static electricity is input to the detection electrode and the wiring electrode around the upper surface of the substrate other than the detection area and the end portion thereof, there is a problem that false recognition of the position coordinates occurs and the electrode itself are destroyed.

For this reason, in the touch panel of the Patent Literature 1, a first shielding electrode is formed so as to surround an area including the detection area and the wiring area, and noise entering from the end portion of the substrate is shielded. Thereby, the touch panel prevents noise from reaching the wiring electrode and the detection electrode.

Patent Literature 1: JP 2010-218542 A

SUMMARY OF THE INVENTION

However, in the touch panel disclosed in the Patent Literature 1, it is necessary to provide the first shielding electrode around the sensor electrode. As a result, dead space is increased. For this reason, in a case miniaturizing the touch panel, there is a problem that restriction in design occurs.

Further, in addition to a method of surrounding the sensor electrode with the shielding electrode like the touch panel of the Patent Literature, a method of laminating a high insulation film on the surface of the sensor electrode is considered, but optimum thickness and material must be selected depending on the touch panel to be produced. Furthermore, a problem running up manufacturing costs due to increased parts is caused.

In order to solve the problem, it is an object of the present invention to provide a touch panel which can reduce manufacturing costs without design restriction and control adverse effect subjecting by noise current due to external discharge such as static electricity generated when operating the touch panel.

To achieve the object, a first aspect of the present invention is a touch panel comprising: a housing unit; and a sensor unit in which an electrode section having a first electrode and a second electrode is formed on a back surface of a substrate having translucency such that an intersection between the first and second electrodes where the first and second electrodes are constructed with a plurality of electrode rows intersect each other is insulated. A notch portion is formed on a front surface side of the substrate so as to cover a wiring area of a lead-out wiring portion extracted from the sensor unit arranged on a back surface side of the substrate, and the housing unit has a noise guiding member for guiding noise current due to external discharge to a ground, and is insert injection molded with a resin material so as to cover the notch portion and to sandwich an outer edge of the substrate from above and below so that the housing unit is flush with the substrate.

A second aspect is the touch panel according to the first aspect, wherein the noise guiding member is made of a metal material having conductive property, and integrally formed with the housing unit such that one end of the noise guiding member is arranged in a location not projecting from an outer edge surface of the housing unit and another end thereof passes through to the back surface side so as to be connected to a ground.

A second aspect is the touch panel according to the first and second aspects, wherein the housing unit is formed with a noise guiding member made of a conductive resin material having a resistance value higher than the electrode section and lower than the substrate.

A fourth aspect of the present invention is a touch panel comprising: a sensor unit in which an electrode section having a first electrode and a second electrode is formed on a back surface of a substrate having translucency such that an intersection between the first and second electrodes where the first and second electrodes are constructed with a plurality of electrode rows intersect each other is insulated; and a housing unit bounded to an end surface of the substrate via an adhesive layer, wherein the housing unit is made of a conductive resin material having a resistance value higher than the electrode section and lower than the substrate, and a part thereof is connected to a ground.

According to the present invention, noise current such as static electricity generated during operating is guided toward the ground through the noise guiding member. Therefore, the problem of the electrode section due to the noise current can be prevented.

DESCRIPTION OF THE PREFERRED EMBODIMENT

Hereafter, an embodiment of the present invention will be explained with reference to drawings. The present invention is not limited to an aspect of this embodiment. Various modifications, alternative embodiments, techniques and so on which can be implemented by the person skilled in the art based on the embodiment of the present invention are included in the scope of the present invention.

In the description, when wordings of up, down, left and right are used in order to indicate a direction or position in the following description with reference to each drawing, they correspond to up, down, left and right in a case that a user views each drawing as shown.

In a touch panel 1 of an embodiment in the present invention, a projection-capacitive type which can detect multi-points of fingertip is adopted. The projection-capacitive type touch panel detects the capacitive change of an electrode near a fingertip as a position coordinate on the touch panel 1 from two vertical and horizontal electrode rows when the fingertip approaches.

First, a structure of the touch panel 1 according to the present invention will be explained with reference to FIGS. 1 to 3. The touch panel 1 of the embodiment in the present invention is illustrated in a plan view of a rectangle, but the shape thereof is not limited. For example, the shape may be a square, round, elliptical, polygonal shapes and so on.

Figure 1A:
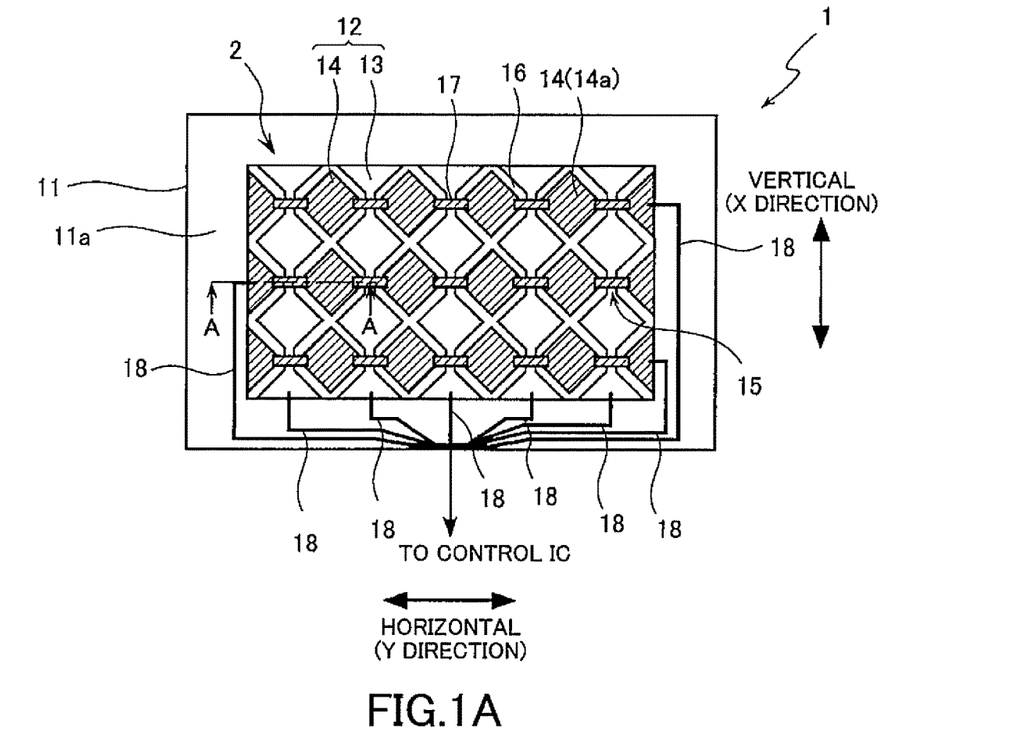
FIG. 1A is a front view seeing a sensor unit of a touch panel according to the present invention from a back surface side.
Figure 1B:
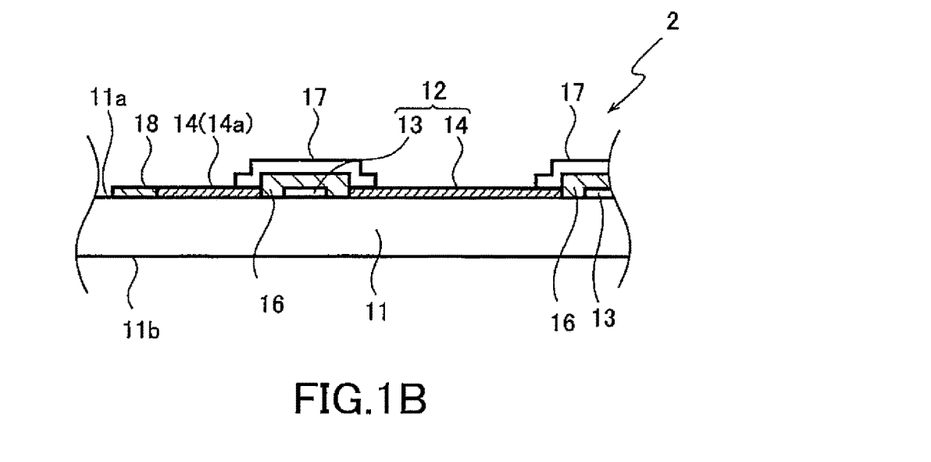
FIG. 1B is an expanded sectional view taken along A-A of FIG. 1A.
Figure 2A:
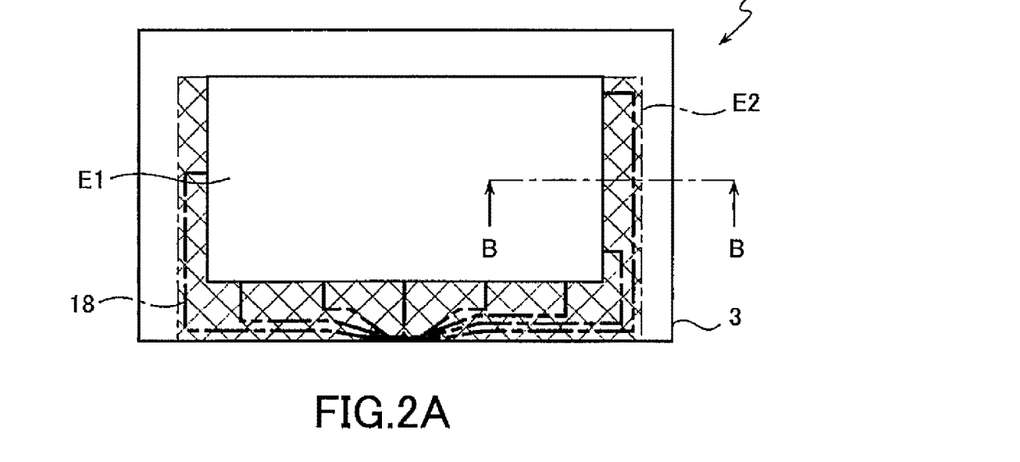
FIG. 2A shows one example of a flat surface of the touch panel according to the present invention.
Figure 2B:
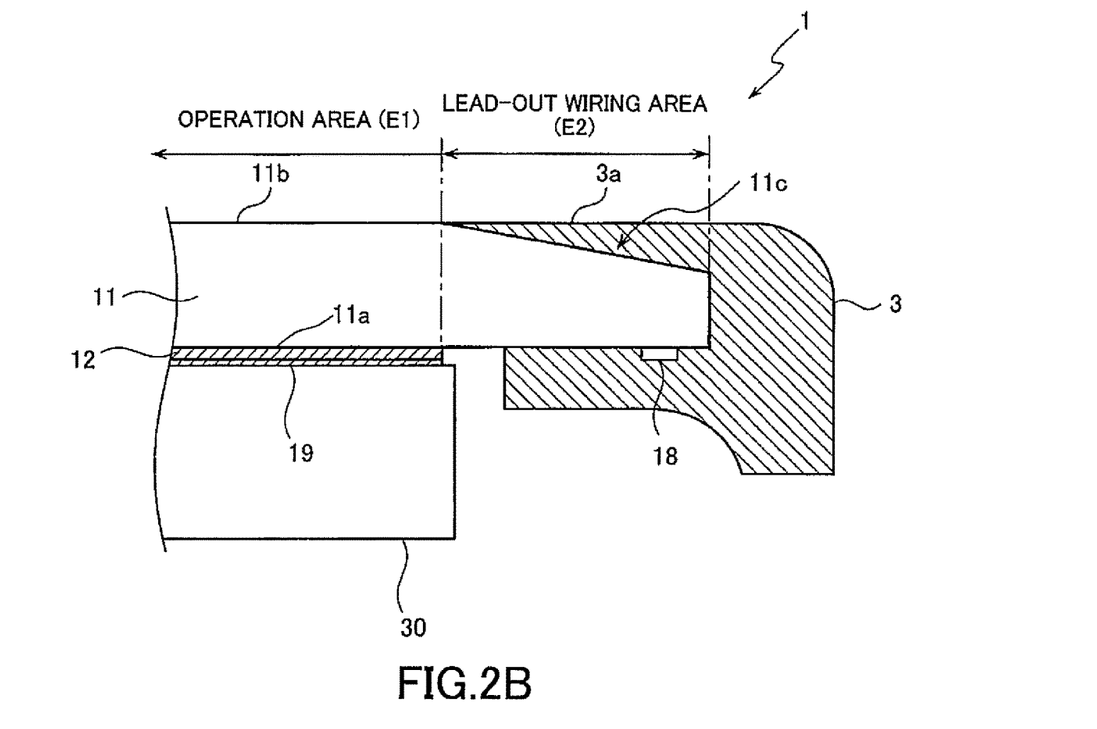
FIG. 2B is a partial expanded sectional view taken along B-B of FIG. 2A.

As shown in FIG. 1 or 2, the touch panel 1 of the embodiment in the present invention includes a sensor unit 2 in which an electrode section 12 having a first electrode 13 and a second electrode 14 is formed on a back surface (a surface opposed to a front surface which is an operation surface) of a substrate 11 having translucency, and a housing unit 3 which is insert injection-molded in a state that the sensor portion 2 is sandwiched in an up-and-down direction (front-and-back direction of the substrate 11).

As shown in FIG. 1A, the sensor unit 2 has the rectangular plate-like substrate 11 as a base portion. The substrate 11 is formed with an insulating material having translucency, and for example a glass type or a film type is used. As the glass type substrate 11, for example, alkali-free glass, soda-lime glass, aluminosilicate glass and the like are used. Further, as the film type substrate 11, for example, a film made of a resin having translucency such as polyethylene terephthalate (PET) is used.

In the back surface 11a (a surface opposed to a surface which is operated by a fingertip, hereafter referred to as the "operation facing surface") of the substrate 11, the first electrode 13 and the second electrode 14 as the electrode section 12 are formed.

The first electrodes 13 are constructed with electrode rows in which a plurality of electrodes are arranged in a vertical direction (X direction is an up-and-down direction in FIG. 1A) of FIG. 1A by etching the film after resist-patterning a transparent conductive film like an ITO (Indium Tin Oxide) by photolithographic technology. In the same manner as the first electrode 13, the second electrodes are constructed with electrode rows in which a plurality of electrodes are arranged in a horizontal (Y direction is horizontal direction in FIG. 1A) of FIG. 1A by etching the film after resist-patterning a transparent conductive film like an ITO (Indium Tin Oxide) by photolithographic technology.

Further, a method for forming the electrode 12 will be explained. First, in the operation facing surface 11a of the substrate 11, a plurality of first electrodes 13 extending in the vertical direction (X direction) of FIG. 1A and a plurality of electrode films arranged in the horizontal direction (Y direction) of FIG. 1A in a divided state are formed. Next, an insulating layer 16 is formed on the first electrode 13 in an intersection 15 of the first electrode 13 and the second electrode 14. A part between the first electrode 13 and the second electrode 14 is electrically insulated by the insulating layer 16. Further, the insulating layer 16 is made of an insulating material such as an acrylic resin. Then, as shown in FIG. 1B, a plurality of electrode films 14a is connected by a bridge wiring (jumper wiring) 17 in a horizontal direction (Y direction) of FIG. 1A over the first electrode 13, and thereby the second electrode 14 is formed. In that case, the bridge wiring 17 connecting between the electrode films 14a, 14a constructing the second electrode 14 is wired so as to pass over the insulating layer 16. Further, in the example, a rectangular portion in an inner side of FIG. 2A in which the electrode section 12 having the first electrode 13 and the second electrode 14 is formed becomes an operation area E1 of the sensor unit 2.

Also, in the forming method of the electrode section 12 described above, the bridge wiring 17 is used for the second electrode 14. Alternatively, it may be used for the first electrode 13 with a structure that the first electrode 13 and the second electrode 14 are reversely constructed. Furthermore, in the first electrode 13 and the second electrode 14, at least the intersection 15 just has to be insulated. For this reason, the insulating layer 16 may be formed on the entire surface of one electrode (first electrode 13 or second electrode 14), and the other electrode (second electrode 14 or first electrode 13) may be formed on the insulating layer 16.

As shown in FIG. 1A, each of end portions of the first electrode 13 and the second electrode 14 formed on the substrate 11 by the forming method described above is drawn out to an end portion of the substrate 11 by a lead-out wiring portion 18, and connected to control IC (control circuit) not shown.

As shown in FIG. 2A, the lead-out wiring portion 18 is a wiring led out from each of the end portions of the first and second electrodes 12, 13 in a lead-out wiring area E2 (the shaded area in FIG. 2A) of U-shaped portion in an outer side of the operation area E1. Further, a metal film such as a Ni (nickel), Nb (niobium), Cu (copper), Mo (molybdenum), MAM (Mo/Al/Mo), APC (alloy containing Ag, Pd, and Cu) and so on is formed by a sputtering method, and a predetermined pattern is formed up to the end portion of the substrate 11 by an etching method.

In order to maintain accuracy as a position sensor, the first electrode 13 and the second electrode 14 are located on the substrate 11 in a matrix form of X and Y directions in a state that the first electrode 13 and the second electrode 14 having a linear electrode are electrically insulated. For this reason, the sensor unit 2 independently detects location where the electrode is located in X and Y directions instead of area on the electrodes, and the position can be calculated from the intersection between the locations.

Furthermore, in an outer edge end portion of a front surface side (an operation surface 11b side of the substrate 11) of the substrate 11, a notch portion 11c is formed so as to cover the lead-out wiring area E2 of the lead-out wiring portion 18 drawn out from the first electrode 13 and the second electrode 14 to the operation facing surface 11a of the substrate 11.

By forming the notch portion 11c in an operation surface 11b side of the substrate 11 under the above conditions, the notch portion 11c is covered with a resin material when insert injection-molding the housing unit 3. Thereby, when the touch panel 1 has been formed, the lead-out wiring portion 18 is not visualized from outside. Furthermore, a decorative layer is not required so as to shield the lead-out wiring portion 18 like the conventional device, and it is possible to achieve the same effect as providing the decorative layer.

Figure 3A:
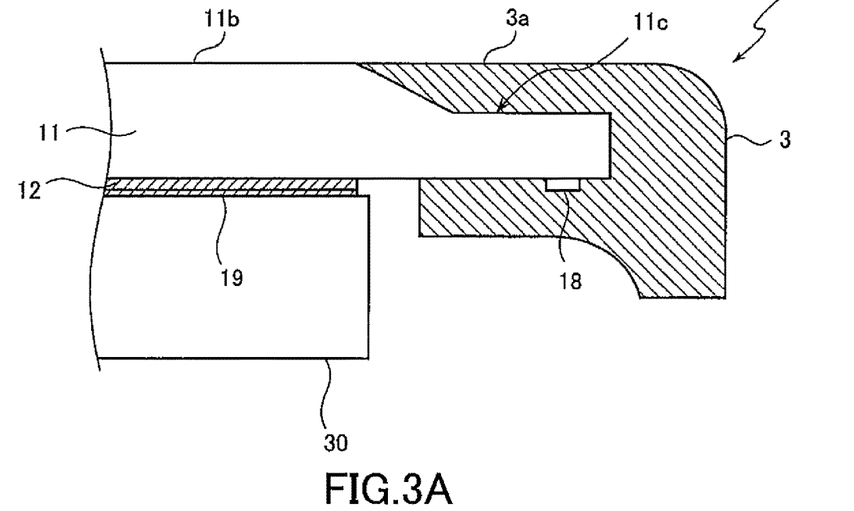
FIGS. 3A and 3B show formation examples of a notch portion formed on a substrate.
Figure 3B:
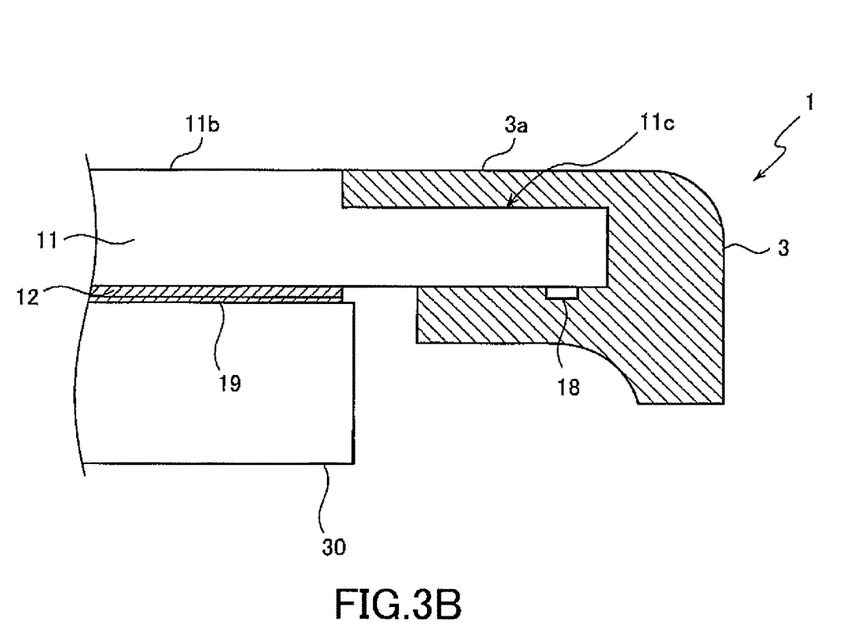

Also, in order to prevent the substrate 11 from being detached from the housing unit 3 by the expansion of the housing unit 3 on usage environment, for example, as shown in FIGS. 3A and 3B, the notch portion 11c is preferably cut so as to increase a contact area with the substrate 11 and to form a step (step portion) having a prescribed shape in an outer side than the operation area E1 in the substrate 11.

Further, when the notch portion 11c is cut with such the step shape, the shape of the step portion shown in FIGS. 3A and 3B and the size thereof are not particularly limited. They can be appropriately designed according to the size of the touch panel 1, the size of the periphery of the housing unit 3, etc.

For example, the housing unit 3 is made of thermoplastic synthetic resin such as general purpose plastic, engineering plastic, and so on. The housing unit 3 sandwiches the outer edge end portion of the substrate 11 from above and below (front surface and back surface) so as to cover the notch portion 11c formed on an operation surface 11b side of the outer edge end portion of the substrate 11. The operation surface 11b side of the operation area E1 (area which is operated by fingertips) of the sensor unit 2 is a front surface. Then, the housing unit 3 is insert injection-molded with a resin material so that the front surface 3a of the housing unit 3 and the operation surface 11b of the substrate 11 are flush and become seamless.

Further, the housing unit 3 is insert injection-molded so as to cover at least the lead-out wiring portion E2 of the lead-out wiring portion 18 in the electrode section 12 formed on the operation facing surface 11a side of the substrate 11. Thereby, the lead-out wiring portion 18 is covered by the housing unit 3. Therefore, the lead-out wiring portion 18 does not corrode under severe conditions like performance evaluation test, and the reliability of the product can be guaranteed.

Furthermore, in the touch panel 1 according to the present invention, countermeasure against noise current described below is taken to control adverse effect (false recognition of position coordinate, destruction of the electrode section 12, and so on) subjecting by noise current due to external discharge such as static electricity generated when operating the touch panel.

Figure 4A:
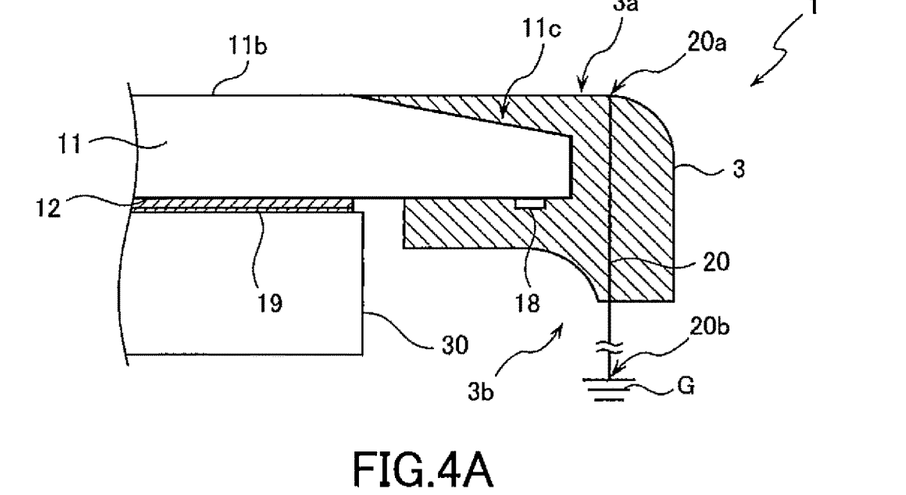
FIG. 4A is a partial expanded sectional view showing an embodiment example using metal material inserted in a housing unit as a noise guiding member.
Figure 4B:
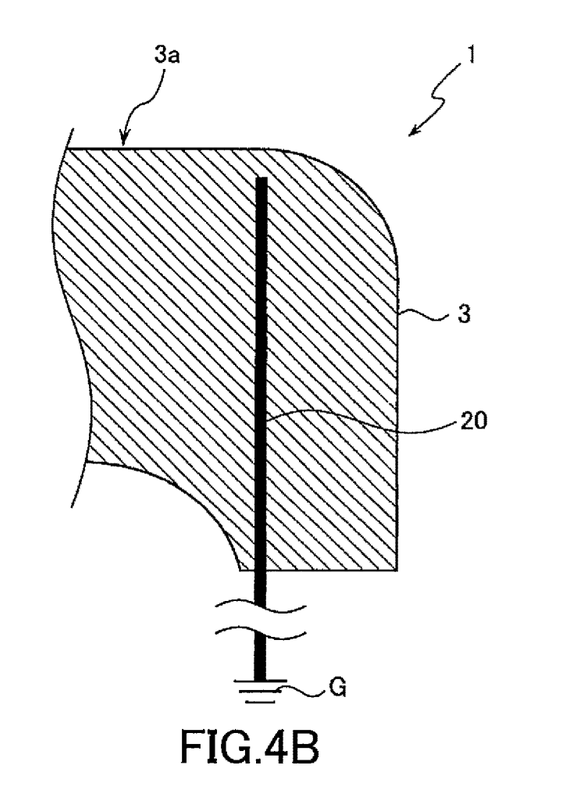
FIG. 4B shows a processing example of the end portion of a front surface side of the noise guiding member.
Figure 5A:
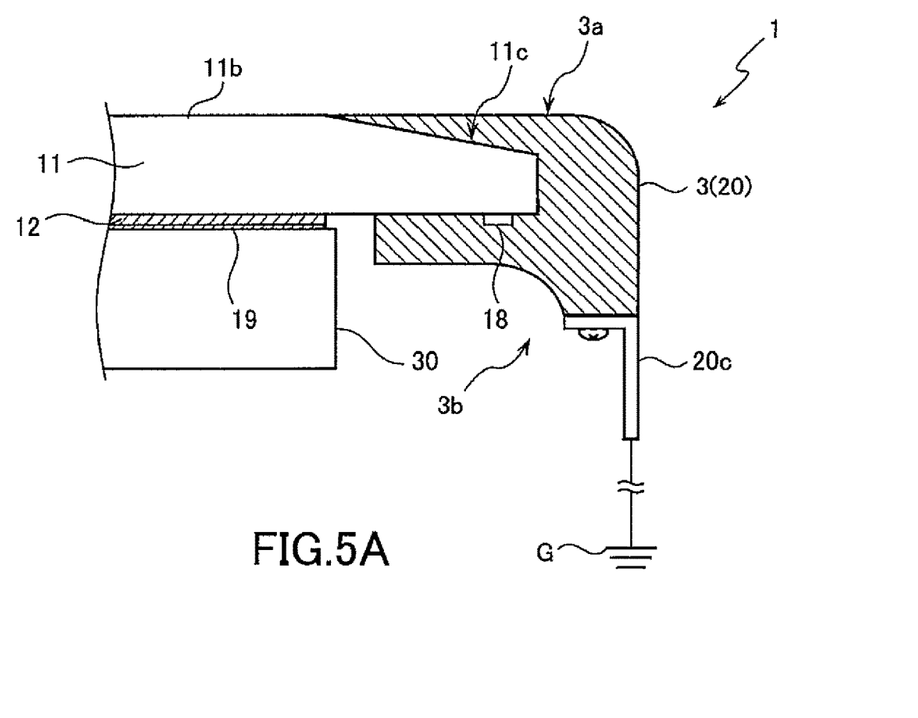
FIGS. 5A and 5B are partial expanded sectional views showing an embodiment example that conductive resin material is used for the housing unit as the noise guiding member.
Figure 5B:
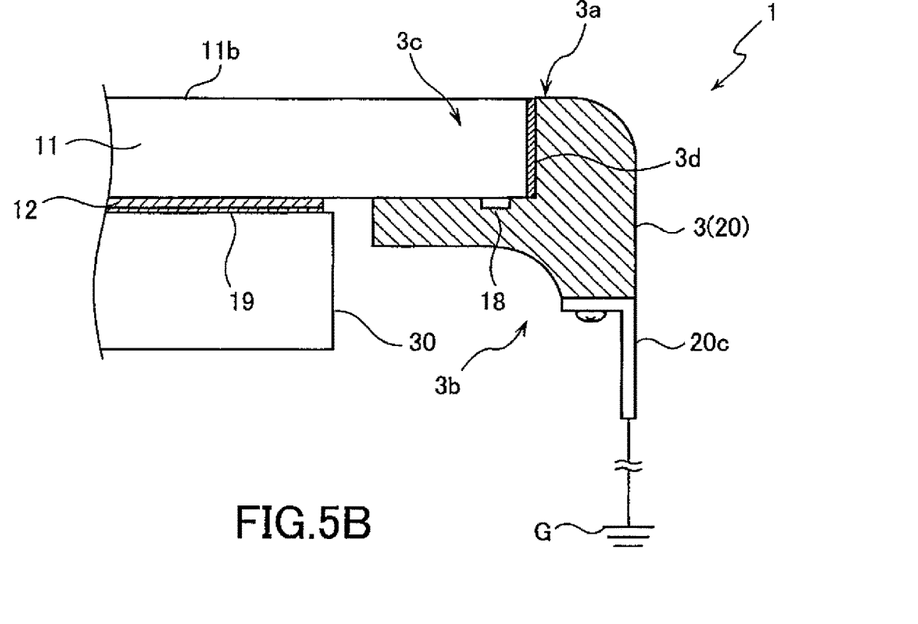
Figure 6:
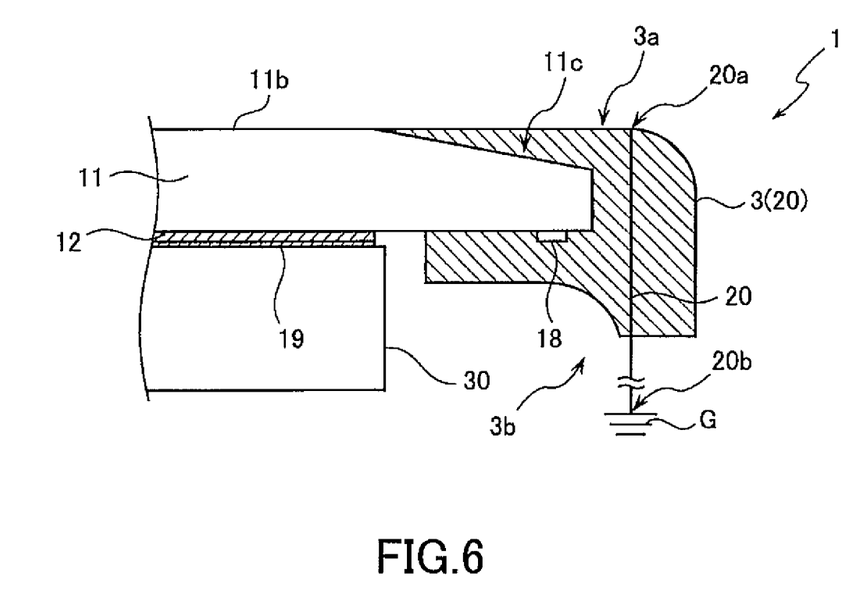
FIG. 6 is a partial expanded sectional view showing an embodiment example using the housing unit made of a conductive resin material as the noise guiding member and metal material inserted into the housing unit.

As shown in any one of FIGS. 4 to 6, the touch panel 1 of the embodiment in the present invention has a noise guiding member 20 for guiding noise current due to external discharge such as static electricity generated when operating the touch panel to the ground G. There are two configurations (configuration examples 1 and 2) of the noise guiding member 20. In the configuration example 1, the noise guiding member 20 is insert molded in a state that a metal material as a conductive member is arranged on a prescribed position of the housing unit 3. In the configuration example 2, the housing unit 3 itself is constructed of a conductive member.

Configuration Example 1

As shown in FIG. 4A, the noise guiding member 20 of the configuration example 1 is formed with a linear shape. One end (front surface side end portion 20a) of the noise guiding member 20 is arranged so as to not project from the front surface of the housing unit 3 and a side surface thereof, and the other end (back surface side end portion 20b) is connected to the ground G. In FIGS. 4A and 4B, a metal material functioning as the noise guiding member 20 is formed with a linear shape, but it is not limited thereto. For example, the noise guiding member may be formed with a polygonal column shape such as a triangle prism and square prism when the noise current can be guided to the ground. Thereby the shape may be any shape.

The metal material used for the noise guiding member 20 consists of metal material having a resistance value lower than at least the housing unit 3 and the electrode section 12 (For example, alloy steel like SUS (stainless), and single metal like Cu (copper), Al (aluminum) and Ag (sliver). When the noise guiding member 20 is mounted on the touch panel device, an exposed surface of the front surface side end portion 20a has a size being hard to visually recognize by an operator (As one example, when the noise guiding member 20 is formed with a linear shape, the size is approximately φ0.1 mm).

Further, material having resistance (weather resistance, corrosion resistance, and so on) necessary for the use environment of the device on which the touch panel 1 is mounted, or material to which predetermined machining is applied so as to have resistance can be used as the metal material.

Also, paint of the same color as or similar to that of the housing unit 3 is applied to the exposed portion of the front surface side end portion 20a by dipping. As a result, outwardly the noise guiding member 20 can be hardly visually recognized seemingly. The painting process may be omitted when a wire diameter (exposed surface area of the front surface side end portion 20a) of the metal material becoming the noise guiding member 20 is small and it is difficult to visually recognize.

In FIG. 4A, the front surface side end portion 20a of the noise guiding member 20 is arranged so as to flush with the front surface 3a of the housing unit 3. Meanwhile, as shown in FIG. 4B, the front surface side end portion 20a may be insert-molded in a state that the end surface of the front surface side end portion 20a is located inward a predetermined distance from the front surface 3a (a state of being embedded).

In a case having such structure, an inward distance from the front surface 3a is appropriately defined according to the size (exposed surface area of the front surface side end portion 20a) of the metal material to be the noise guiding member 20 and quality of material.

Configuration Example 2

The noise guiding member 20 of the configuration example 2 has the housing unit 3 formed with a conductive resin material having a resistance value higher than the electrode section 12 and lower than the substrate 11. As shown in FIG. 5A, the housing unit 3 functioning as the noise guiding member 20 is installed via a fitting member 20c (L-shaped metal fitting and screw in FIG. 5A) with a touch panel device main body so as to be connected to the ground G when the housing unit 3 is fitted to a display device 30 in which the touch panel 1 is installed.

For example, the substrate 11 of the touch panel 1 is made of glass materials (optionally selected from soda-lime glass, aluminosilicate glass, alkali-free glass and the like), and the electrode section 12 is made of a metal film (Ni (nickel), Nb (niobium), Cu (copper), Mo (molybdenum, MAM ((Mo/Al/Mo), APC (alloy containing Ag, Pd, and Cu), and the like). In this case, the conductive resin material to be the noise guiding member 20 of the configuration example 2 may use materials adjusted by suitably adding graphite or CNT (carbon nanotube) to a resin material such as PP (polypropylene), PE (polyethylene), ABS (acrylonitrile butadiene styrene resin), PC (Polycarbonate resin), PMMA (acrylic resin), ABS+PMMA, and the like according to the material of the substrate 11 and electrode section 12 so that a resistance value becomes higher than the electrode section 12 and lower than the substrate 11.

The housing unit 3 in the configuration example 2 does not need to be insert-molded. For example, as shown in FIG. 5B, a recess portion 3c is provided in the housing unit 3 so as to attach the substrate 11 thereto. The substrate 11 may be attached and fixed to the recess portion 3c of the housing unit 3 via an adhesive layer 3d made of adhesive or adhesive tape. Even in such a configuration, as well as the above structure, the noise current generated when operating the panel can be guided to the ground G through the housing unit 3 from the substrate 11.

Further, the noise guiding member 20 may have a structure combining the configuration examples 1 and 2 described above. In other words, as shown in FIG. 6, the resin material shown in the configuration example 2 as a resin material of the housing unit 3 can be adopted, the metal material for guiding the noise current shown in the configuration example 1 may be insert-molded, and thereby the touch panel 1 may be manufactured. In such structure, the metal material of the noise guiding member 20 and the resin material of the housing unit 3 may adopt a material having a resistance value lower than at least the electrode section 12.

Further, as shown in FIG. 2B, in the touch panel 1 constructed as described above, the operation facing surface 11a (surface in which the sensor unit 2 is formed) of the substrate 11 is attached and fixed to the display device 30 (for example, various display devices such as a liquid crystal display, EL display and so on) through an adhesive layer 19 like a transparent adhesive tape.

Thereby, since the touch panel 1 is mounted on the display device 30 as one form of an input device, the display device 30 can function as a display device with a touch panel (touch panel device).

Further, when the noise guiding member 20 like the above configuration example 1 is made of the metal material insert injection-molded in the housing unit 3, as shown in FIG. 4A, the noise guiding member 20 is attached and fixed to the display device 30 in a state that the back surface side end portion 20b is connected to the ground G. Thereby, the noise current such as static electricity generated when operating the panel flows in the ground G through the noise guiding member 20. As a result, a problem of the electronic section 12 due to the noise current can be prevented.

Furthermore, when the noise guiding member 20 like the above configuration example 2 is made of the housing unit 3, as shown in FIG. 5A, a part of the housing unit 3 is attached to the touch panel device via the fitting member 20c connected to the ground G. Thereby, the noise current such as static electricity generated by operating the panel flows in the ground G through the noise guiding member 20. Therefore, the problem of the electrode section 12 caused by the noise current can be suppressed.

As explained above, the touch panel 1 of the embodiment in the present invention has the noise guiding member 20 for guiding the noise current such as static electricity generated by operating. The noise guiding member 20 is made of the metal material placed on a position in which the front surface side end portion 20a does not project from the front surface 3a of the housing unit 3 so as to pass through the back surface 3b from the front surface 3a of the housing unit 3 in a state that the back surface side end portion is connected to the ground G.

For this reason, the noise current (static electricity) generated on the front surface 3a which is the operation surface is guided toward the ground G through the noise guiding member 20. Therefore, the problem of the electrode section 12 due to the noise current can be prevented.

Further, in the other form of the noise guiding member 20, the housing unit 3 formed with the conductive resin material having the resistance value higher than the electrode section 12 and lower than the substrate 11 is used, and a part of the housing unit 3 is connected to the ground G.

Thereby, the noise current (static electricity) generated on the front surface 3a of the operation surface is guided toward the ground G via the noise guiding member 20. Therefore, the problem of the electrode section 12 caused by the noise current can be prevented.

REFERENCE SIGNS LIST 1 touch panel
2 sensor unit
3 housing unit
3a front surface
3b back surface
3c recess portion
3d adhesive layer
11 substrate
11a back surface (operation facing surface)

11b front surface (operation surface)
11c notch portion
12 electrode section
13 first electrode
14 second electrode
14a electrode film,
15 intersection
16 insulating layer
17 bridge wiring
18 lead-out wiring portion
20 noise guiding member
20a front surface side end portion
20b back surface side end portion
20c fitting member
30 display device
E1 operation area
E2 lead-out wiring area
G ground

What is claimed is:

1. A projection-capacitive touch panel comprising:
a housing unit;
a sensor unit in which an electrode section having a first electrode and a second electrode is formed on a back surface of a substrate having translucency such that an intersection between the first and second electrodes where the first and second electrodes are constructed with a plurality of electrode rows intersect each other is insulated;
wherein a notch portion is formed on a front surface side of the substrate so as to cover a wiring area of a lead-out wiring portion extracted from the sensor unit arranged on a back surface side of the substrate,
the housing unit has a noise guiding member for guiding noise current due to external discharge to a ground located outside the substrate and the housing unit, and is insert injection molded with a resin material so as to cover the notch portion and to sandwich an outer edge of the substrate from above and below so that the housing unit is flush with the substrate, and
the noise guiding member is installed via a fitting member and a screw, wherein the fitting member is connected to the ground.

2. The touch panel according to claim 1, wherein the housing is made of a conductive resin material having a resistance value higher than the electrode section and lower than the substrate.

* * * * *